United States Patent
Helke

(10) Patent No.: US 7,387,745 B2
(45) Date of Patent: Jun. 17, 2008

(54) PIEZOELECTRIC CERAMIC MATERIALS BASED ON LEAD ZIRCONATE TITANATE (PZT) HAVING THE CRYSTAL STRUCTURE PEROVSKITE

(75) Inventor: Gunter Helke, Lauf-Heuching (DE)

(73) Assignee: CeramTec AG, Plochingen (DE)

( * ) Notice: Subject to any disclaimer, the term of this patent is extended or adjusted under 35 U.S.C. 154(b) by 271 days.

(21) Appl. No.: 10/490,496

(22) PCT Filed: Sep. 20, 2002

(86) PCT No.: PCT/DE02/03528

§ 371 (c)(1),
(2), (4) Date: Sep. 7, 2004

(87) PCT Pub. No.: WO03/029162

PCT Pub. Date: Apr. 10, 2003

(65) Prior Publication Data

US 2005/0006620 A1    Jan. 13, 2005

(30) Foreign Application Priority Data

Sep. 29, 2001  (DE) ............................. 101 48 378
Jun. 28, 2002  (DE) ............................. 102 29 086

(51) Int. Cl.
  *C04B 35/493*  (2006.01)
  *H01L 41/187*  (2006.01)
(52) U.S. Cl. .................. 252/62.9 PZ; 501/134
(58) Field of Classification Search ......... 252/62.9 PZ; 501/134

See application file for complete search history.

(56) References Cited

U.S. PATENT DOCUMENTS 5,378,382 A    1/1995  Nishimura et al.

FOREIGN PATENT DOCUMENTS

| | | |
|---|---|---|
| DE | 100 24 823 A | 6/2001 |
| JP | 07 257924 A | 10/1995 |
| JP | 11 001368 A | 1/1999 |

OTHER PUBLICATIONS

Translation for JP07-257924.*

* cited by examiner

*Primary Examiner*—C. Melissa Koslow
(74) *Attorney, Agent, or Firm*—Fulbright & Jaworski L.L.P.

(57) ABSTRACT

The invention relates to piezoelectric ceramic materials based on the system $Pb(Zr,Ti)O_3$, i.e. solid solutions of lead zirconate $PbTO_3$, characterized by having very good dielectric and electromechanical properties that can be adopted for different uses by modifying the composition. The piezoelectric ceramic materials based on the system $Pb(Zr,Ti)O_3$ are modified in order to obtain a high level of piezoelectric activity. The invention provides piezoelectric ceramic materials based on lead zirconate titanate (PZT) having the crystal structure of perovskite with formula $A^{2+}B^{4+}O_3^{2-}$, which are characterized by a substitution of heterovalent acceptor and donator ions at Zr/Ti sites.

5 Claims, No Drawings

PIEZOELECTRIC CERAMIC MATERIALS BASED ON LEAD ZIRCONATE TITANATE (PZT) HAVING THE CRYSTAL STRUCTURE PEROVSKITE

This is a §371 of PCT/DE02/03528 filed Sep. 20, 2002, which claims priority from German 101 48 378.3 filed Sep. 29, 2001 and German 102 29 086.5 filed Jun. 28, 2002 all of which are hereby incorporated by reference in their entireties.

The invention relates to piezoelectric ceramic materials based on lead zirconate titanate (PZT) having the crystal structure of perovskite with the formula $A^{2+}B^{4+}O_3^{2-}$.

Piezoceramic materials based on the $Pb(Zr,Ti)O_3$ system—that is to say, solid solutions of lead zirconate $PbZrO_3$ and lead titanate $PbTiO_3$—are distinguished by very good dielectric and electromechanical properties, which can be adapted for different applications by modification of the composition.

Varying techniques for modifying the composition have been developed for the purpose of satisfying strict requirements in special applications. The modification of the composition arises as a result of partial substitution of ions of the same valency at Pb sites and Zr/Ti sites and as a result of doping with ions of differing valency, and also as a result of substitution of ion complexes.

By virtue of the doping with ions of differing valency varying effects are achieved, depending on ion radius and valency. By means of "donor ions" such as $La^{3+}$ and $Nd^{3+}$ at $Pb^{2+}$ sites, or $Nb^{5+}$ at $(Zr/Ti)^{4+}$ sites, so-called "soft" piezoceramics arise which are distinguished, in particular, by a large dielectric constant and a high piezoelectric activity. By means of "acceptor ions" such as $K^+$ and $Na^+$ at $Pb^{2+}$ sites, or $Fe^{3+}$ at $(Zr/Ti)^{4+}$ sites, so-called "hard" piezoceramics arise which are distinguished, in particular, by low dielectric and mechanical losses—that is to say, high quality—and high coercivity.

The charge deficits generated by the respective ion-type are compensated by formation of singly charged lead defects or oxygen defects.

A coupled substitution of heterovalent ions can be taken advantage of for controlling the effects of donor and acceptor ions. As a result it becomes possible, for example, to compensate, fully or at least partially, the charge deficits brought about by acceptor doping by means of excess charge arising as a result of donor doping. By virtue of the coupled substitution of donor and acceptor ions it is possible to distinctly enhance the stability of piezoceramics based on lead zirconate titanate while maintaining the piezoelectric activity and the high dielectric constant, as is known from DE 198 40 488 A1.

Diverse possibilities for the modification of solid solutions of the $Pb(Zr,Ti)O_3$ system arise with the partial substitution of complex compounds in the form of valency-compensated compositions in multi-component systems having the general notation $PbTiO_3$—$PbZrO_3$-$\Sigma_n A'_\alpha A''_\beta B'_\chi B''_\delta O_3$. In the case of addition of only one of these complex compounds to the binary system of the $PbZrO_3$—$PbTiO_3[Pb(Zr,Ti)O_3]$ solid solutions, "ternary" solid solutions can be formed having a great range of variation of the dielectric and electromechanical properties. Such complex compounds also include those having the chemical formula $A^{2+}(B^{3+}_{1/2}B^{5+}_{1/2})O_3$ with $A^{2+}=Pb^{2+}$, $Sr^{2+}$ or $Ba^{2+}$. With the ion-pair $B^{3+}/B^{5+}$ there is also a coupled substitution of trivalent acceptor ions and pentavalent donor ions, for example of $Fe^{3+}/Nb^{5+}$ in a $Pb(Fe^{3+}_{1/2}Nb^{5+}_{1/2})O_3$ complex, at $(Zr/Ti)^{4+}$ sites in the $Pb(Zr,Ti)O_3$ system. In this case the coupled substitution brings about charge neutrality, so that charge deficits, which have to be balanced out by formation of charged defects, cannot arise. Nevertheless, with the coupled substitution of the ion-pair $Fe^{3+}/Nb^{5+}$ a change occurs in the dielectric and electromechanical properties of the PZT ceramics modified in this way.

The object of the present invention is to modify the piezoelectric ceramic materials based on the $Pb(Zr,Ti)O_3$ system in such a way that a high level of piezoelectric activity is set.

This object is achieved with the aid of the characterising features of the first claim. Advantageous configurations of the invention are claimed in the dependent claims.

According to the invention, lead-zirconate-titanate materials based on the $Pb(Zr,Ti)O_3$ system are modified by substitution of heterovalent acceptor and donor ions at Zr/Ti sites. By virtue of coupled substitution of heterovalent acceptor and donor ions at Zr/Ti sites, i.e. at $B^{4+}$ sites in the perovskite having the general formulation $A^{2+}B^{4+}O_3^{2-}$, for the purpose of forming only partially valency-compensated compositions of the PZT system a high level of piezoelectric activity is set. Materials of such a system are distinguished by a high Curie temperature and, in particular, also by a controlled sintering activity, so that different forming and sintering processes for piezoceramic components consisting of materials pertaining to this system can be employed.

In the modified PZT system a coupled substitution of $Al^{3+}$ acceptor ions and $Nb^{5+}$ donor ions in compositions having the general formulation $[Pb_{0.995}Sr_{0.02}][Al_{0.005}(Zr_xTi_{1-x})_{0.975}Nb_{0.02}]O_3$ enters into consideration, for example.

A piezoelectric ceramic material comprising lead zirconate titanate (PZT) having the formula $Pb^{2+}(Zr^{4+},Ti^{4+})O_3^{2-}$ and the crystal structure of perovskite having the formula $A^{2+}B^{4+}O_3^{2-}$, characterized by substitution of partially valence compensating acceptor and donor ion pairs $B^{3+}_y/B^{5+}_z$ for the formation of only partially valence compensated compositions of the system $Pb^{2+}_{1-w}Sr^{2+}_w[B^{3+}_y(Zr_xTi_{1-x})^{4+}_{1-y-z}Nb^{5+}_z]O^{2-}_3$ wherein w=0.00 to 0.005, x=0.50 to 0.55, y<z, and z=0.00 to 0.05, wherein a coupled substitution of heterovalent acceptor and donor ions at Zr/Ti sites is present in the material and the $B^{4+}$ site is occupied by $Al^{3+}$ or $Fe^{3+}$ ions.

For direct comparison, use was made of the composition $0.98Pb(Zr_{0.52}Ti_{0.48})O_3$-$0.02Sr(Al_{0.5}Nb_{0.5})O_3$, a valency-compensated coupled substitution of acceptor and donor ions.

The properties of the composition $0.98Pb(Zr_{0.52}Ti_{0.48})O_3$-$0.02Sr(Al_{0.5}Nb_{0.5})O_3$ by way of model substance with the hypothetical acceptor-donor complex $(AL_{0.5}Nb_{0.5})O_3$ show that it is not possible to produce materials having a high piezoelectric activity and controlled sintering activity by valency compensation in the case of substitution of the ion-pair $Al^{3+}Nb^{5+}$ in the ion complex $Sr(Al_{0.5}Nb_{0.5})O_3$. The dielectric and electromechanical characteristic values of compositions with valency-compensated coupled substitution are significantly lower than those of the composition with partial valency compensation.

The sintering temperatures of the piezoceramics pertaining to the $[Pb_{0.995}Sr_{0.02}][Al_{0.005}(Zr_xTi_{1-x})_{0.975}Nb_{0.02}]O_3$ system are around 1100° C. to 1200° C. and therefore about 50° C. to 70° C. below the sintering temperatures of piezoceramics pertaining to the $0.98Pb(Zr_{0.52}Ti_{0.48})O_3$-$0.02Sr(Al_{0.5}Nb_{0.5})O_3$ system.

Further examples of a coupled substitution of heterovalent acceptor and donor ions at Zr/Ti sites, i.e. $B^{4+}$ sites, are compositions of the system having the general formulation [Pb$_{0.995}$Sr$_{0.02}$][Fe$_{0.005}$(Zr$_x$Ti$_{1-x}$)$_{0.975}$Nb$_{0.02}$]O$_3$ wherein x is 0.5 to 0.55.

There follow three examples of the compositions according to the invention, as well as an example of a reference composition:

1. Piezoelectric ceramic material having the composition [Pb$_{0.995}$Sr$_{0.02}$][Al$_{0.005}$(Zr$_{0.53}$Ti$_{0.47}$)$_{0.975}$Nb$_{0.02}$]O$_3$
Forming: dry pressing
Sintering temperature: 1200° C.
Material data:

| | |
|---|---|
| dielectric constant $\epsilon_{33}^T/\epsilon_0$ | 1980 |
| dielectric loss factor tan δ, 10$^{-4}$ | 155 |
| planar electromechanical coupling factor k$_p$ | 0.66 |
| longitudinal electromechanical coupling factor k$_{33}$ | 0.74 |
| piezoelectric modulus d$_{33}$, 10$^{-12}$ C/N | 495 |
| mechanical quality factor Q | 70 |
| Curie temperature, ° C. | 345 |

2. Piezoelectric ceramic material having the composition [Pb$_{0.995}$Sr$_{0.02}$][Al$_{0.005}$(Zr$_{0.53}$Ti$_{0.47}$)$_{0.975}$Nb$_{0.02}$]O$_3$
Forming: film casting
Sintering temperature: 1180° C.
Material data:

| | |
|---|---|
| dielectric constant $\epsilon_{33}^T/\epsilon_0$ | 1860 |
| dielectric loss factor tan δ, 10$^{-4}$ | 160 |
| planar electromechanical coupling factor k$_p$ | 0.64 |
| piezoelectric modulus d$_{33}$, 10$^{-12}$ C/N | 450 |
| mechanical quality factor Q | 65 |
| Curie temperature, ° C. | 343 |

3. Piezoelectric ceramic material having the composition [PbSr$_{0.02}$][Fe$_{0.005}$(Zr$_{0.53}$Ti$_{0.47}$)$_{0.995}$Nb$_{0.02}$]O$_3$
Forming: dry pressing
Sintering temperature: 1200° C.
Material data:

| | |
|---|---|
| dielectric constant $\epsilon_{33}^T/\epsilon_0$ | 2010 |
| dielectric loss factor tan δ, 10$^{-4}$ | 170 |
| planar electromechanical coupling factor k$_p$ | 0.66 |
| longitudinal electromechanical coupling factor k$_{33}$ | 0.73 |
| piezoelectric modulus d$_{33}$, 10$^{-12}$ C/N | 495 |
| mechanical quality factor Q | 70 |
| Curie temperature, ° C. | 349 |

Forming: film casting

Sintering temperature: 1250° C.
Material data:

| | |
|---|---|
| dielectric constant $\epsilon_{33}^T/\epsilon_0$ | 975 |
| dielectric loss factor tan δ, 10$^{-4}$ | 45 |
| planar electromechanical coupling factor k$_p$ | 0.36 |
| piezoelectric modulus d$_{33}$, 10$^{-12}$ C/N | 305 |
| mechanical quality factor Q | 125 |
| Curie temperature, ° C. | 355 |

The piezoelectric ceramic materials according to the invention, which are produced by mixed-oxide technology, are suitable in particular for the production of films that are employed in the metallised and polarised state in sensors. Mixed-oxide technology is a process known from the state of the art, total synthesis of the PZT being undertaken from a raw-material mixture of the components, e.g. oxides and carbonates, corresponding to the nominal composition of the PZT. From the films it is possible for multilayer actuators to be produced, in particular those having monolithic structures. The sintering temperature advantageously lies within the range from 1100° C. to 1200° C.

The invention claimed is:

1. A piezoelectric ceramic material comprising lead zirconate titanate (PZT) having the formula Pb$^{2+}$(Zr$^{4+}$,Ti$^{4+}$)O$_3^{2-}$ and the crystal structure of perovskite having the formula A$^{2+}$B$^{4+}$O$_3^{2-}$, characterized by substitution of partially valence compensating acceptor and donor ion pairs B$^{3+}_y$/B$^{5+}_z$ for the formation of only partially valence compensated compositions of the system
Pb$^{2+}_{1-w}$Sr$^{2+}_z$[B$^{3+}_y$(Zr$_x$Ti$_{1-x}$)$^{4+}_{1-y-z}$Nb$^{5+}_z$]O$^{2-}_3$
wherein w=0.00 to 0.005, x=0.50 to 0.55, y<z, and z=0.00 to 0.05,
wherein a coupled substitution of heterovalent acceptor and donor ions at Zr/Ti sites is present in the material and the B$^{4+}$ site is occupied by Al$^{3+}$ or Fe$^{3+}$ ions.

2. A piezoelectric ceramic material having the formula [Pb$_{0.995}$Sr$_{0.02}$][Al$_{0.005}$(Zr$_x$Ti$_{1-x}$)$_{0.975}$Nb$_{0.02}$]O$_3$, where x=0.50 to 0.55.

3. A piezoelectric ceramic material having the formula [Pb$_{0.995}$Sr$_{0.02}$][Fe$_{0.005}$(Zr$_x$Ti$_{1-x}$)$_{0.975}$Nb$_{0.02}$]O$_3$, where x=0.50 to 0.55.

4. A piezoelectric ceramic material as claimed in claim 1, wherein the material is produced by a mixed oxide technique.

5. A piezoelectric ceramic material as claimed in claim 1, wherein the material is sintered at temperatures in the range of 1100° C. to 1200° C.

\* \* \* \* \*